(12) United States Patent
Chen et al.

(10) Patent No.: US 7,589,350 B2
(45) Date of Patent: Sep. 15, 2009

(54) LIGHT-EMITTING DIODE CHIP

(75) Inventors: Ming-Sheng Chen, Tao-Yung Hsien (TW); Liang-Wen Wu, Tao-Yung Hsien (TW); Fen-Ren Chien, Tao-Yung Hsien (TW)

(73) Assignee: Formosa Epitaxy Incorporation, Tao-Yung Hsien (TW)

( * ) Notice: Subject to any disclaimer, the term of this patent is extended or adjusted under 35 U.S.C. 154(b) by 344 days.

(21) Appl. No.: 11/309,088

(22) Filed: Jun. 20, 2006

(65) Prior Publication Data

US 2007/0069218 A1    Mar. 29, 2007

(30) Foreign Application Priority Data

Sep. 29, 2005    (TW) ............................... 94133941 A

(51) Int. Cl.
*H01L 27/15*    (2006.01)
*H01L 29/26*    (2006.01)
*H01L 31/12*    (2006.01)
*H01L 33/00*    (2006.01)

(52) U.S. Cl. .................... 257/79; 257/80; 257/E33.047

(58) Field of Classification Search .................. 257/79, 257/80, E33.047
See application file for complete search history.

(56) References Cited

U.S. PATENT DOCUMENTS

2002/0179914 A1* 12/2002 Sheu ........................... 257/90

FOREIGN PATENT DOCUMENTS

TW    492202    6/2002

* cited by examiner

*Primary Examiner*—Phat X Cao
(74) *Attorney, Agent, or Firm*—Jianq Chyun IP Office

(57) ABSTRACT

A light-emitting diode chip (LED chip) including a substrate, an electrostatic conducting layer, a first type doped semiconductor layer, an active layer, a second type doped semiconductor layer, a first electrode and a second electrode is provided. The electrostatic conducting layer is disposed on the substrate, while the first type doped semiconductor layer is disposed on a partial area of the electrostatic conducting layer. Besides, the active layer is disposed on a partial area of the first type doped semiconductor layer, while the second type doped semiconductor layer is disposed on the active layer. In addition, the first electrode is disposed on the first type doped semiconductor layer, while the second electrode is disposed on the second type doped semiconductor layer. The LED chip of the present invention has an electrostatic conducting layer, which protects the LED from electrostatic discharge damage (ESD damage).

12 Claims, 8 Drawing Sheets

LIGHT-EMITTING DIODE CHIP

CROSS-REFERENCE TO RELATED APPLICATION

This application claims the priority benefit of Taiwan application serial no. 94133941, filed on Sep. 29, 2005. All disclosure of the Taiwan application is incorporated herein by reference.

BACKGROUND OF THE INVENTION

1. Field of Invention

The present invention relates to a light-emitting diode chip (LED chip), and particularly to an LED chip capable of preventing from electrostatic discharge damage.

2. Description of the Related Art

In recent years, LEDs are widely applied, particularly in traffic light apparatuses, large-sized display boards or light source for flat panel displays. To prevent an LED from electrostatic discharge damage (ESD damage), a common solution is use an extra diode, for example a Zener diode, that is reverse and parallel connected to the LED. When an electrostatic discharge occurs, the electrostatic high-voltage characteristic enables the diode, used for avoiding static electricity, to operate in a breakdown voltage zone thereof. In this way, the diode which is reverse and parallel connected to the LED can effectively prevent the LED from ESD damage.

FIG. 1A is a diagram of a conventional flip-chip packaged LED chip and FIG. 1B is a diagram of the LED circuit in FIG. 1A. Referring to FIGS. 1A and 1B, a conventional flip-chip packaged LED chip 100 includes an LED 110 and a diode 120. The LED 110 includes a substrate 112, an N-type doped semiconductor layer 114, an active layer 116, a P-type doped semiconductor layer 118, a transparent conductor layer 119, an electrode 1 and an electrode 2. The above-mentioned N-type doped semiconductor layer 114 is disposed on the substrate 112, while the active layer 116 is disposed between the N-type doped semiconductor layer 114 and the P-type doped semiconductor layer 118. In addition, the electrode 1 and the transparent conductor layer 119 are disposed on the P-type doped semiconductor layer 118, while the electrode 2 is disposed on the N-type doped semiconductor layer 114.

The above-described diode 120 includes an N-type doped region 122 and a P-type doped region 124. The LED 110 is electrically connected to the N-type doped region 122 and the P-type doped region 124 of the diode 120 through solders W1 and W2. In other words, the LED 110 is reverse and parallel connected to the diode 120 (as shown in FIG. 1B); the electrode 1 of the LED 110 and the N-type doped region 122 of the diode 120 are electrically coupled to an operation voltage V1; the electrode 2 of the LED 110 and the P-type doped region 124 of the diode 120 are electrically coupled to an operation voltage V2.

When an electrostatic discharge occurs, the electrostatic high-voltage characteristic enables the diode 120 to operate in a breakdown voltage zone thereof and the static charges would pass through the diode 120 instead of passing through the LED 110. Hence, the static charges are conducted by the diode and expelled from the LED chip 100, and the LED 110 is protected from an electrostatic damage by using the diode 120.

The above-described flip-chip packaged LED chip 100 needs an extra semiconductor substrate to fabricate the diode 120, followed by welding them (the LED 110 and the diode 120) though the solders W1 and W2, which requires a higher production cost.

FIG. 2A is a diagram of another conventional LED chip and FIG. 2B is a diagram of the LED circuit in FIG. 2A. Referring to FIGS. 2A and 2B, a conventional LED chip 200 includes a substrate 210, an unintentionally-doped layer 220, an N-type doped semiconductor layer 230, an active layer 240, a P-type doped semiconductor layer 250, a transparent conductor layer 251, a first metal layer 260, a first oxidation layer 261, a second metal layer 270, a second oxidation layer 271, an electrode 3 and an electrode 4.

The above-mentioned unintentionally-doped layer 220 is disposed on the substrate 210, while the N-type doped semiconductor layer 230 is disposed on the unintentionally-doped layer 220. In addition, the active layer 240 is disposed between the P-type doped semiconductor layer 250 and the N-type doped semiconductor layer 230; the electrode 3 and the transparent conductor layer 251 are disposed on the P-type doped semiconductor layer 250; and the electrode 4 is disposed on the N-type doped semiconductor layer 230. It is noted that, the electrode 3 is electrically connected to the unintentionally-doped layer 220 through the first metal layer 260 in the via hole H1 and the first oxidation layer 261 is disposed on the sidewall of the via hole H1. The first oxidation layer 261 enables the first metal layer 260 being insulated from other film layers (the N-type doped semiconductor layer 230, the active layer 240 and the P-type doped semiconductor layer 250).

The above-described electrode 4 is connected to the unintentionally-doped layer 220 through the second metal layer 270 in the via hole H2. The second oxidation layer 271 is disposed on the sidewall of the via hole H2 and enables the second metal layer 270 being insulated from the N-type doped semiconductor layer 230. It should be noted that, there is a Schottky contact between the first metal layer 260 and the unintentionally-doped layer 220 and between the first metal layer 260 and the unintentionally-doped layer 220, respectively. In addition, the electrode 3 is electrically coupled to the operation voltage V1, while the electrode 4 is electrically coupled to the operation voltage V2.

When an electrostatic discharge occurs, the electrostatic high-voltage characteristic enables the diode 202 (as shown in FIG. 2B) to operate in a breakdown voltage zone thereof and the static charges would flow through the diode 202. In other words, the static charges would sequentially flow through the electrode 4, the second metal layer 270, the unintentionally-doped layer 220, the first metal layer 260 and the electrode 3. In this way, the static charges will not flow into the LED 201 so that the diode 202 can protect the LED 201 from electrostatic damage.

However, the first metal layer 260 and the second metal layer 270 of the LED chip 200 must be electrically insulated from the film layers except for the unintentionally-doped layer 220, the electrode 3 and the electrode 4. Therefore, the first oxidation layer 261 and the second oxidation layer 271 formed on the sidewall of the via hole H1 and the via hole H2, respectively, are necessary by the prior art. As a result, a new problem arises that, the deeper the via holes H1 and H2, the more difficult to form the first oxidation layer 261 and the second oxidation layer 271 in the via holes H1 and H2. In other words, the production yield becomes worse.

FIG. 3A is a diagram of a further conventional LED chip and FIG. 3B is a diagram of the LED circuit in FIG. 3A. Referring to FIGS. 3A and 3B, an LED chip 300 is formed by an LED 301 and a diode 302. The LED 301 includes a substrate 310, an N-type doped semiconductor layer 320, an active layer 330, a P-type doped semiconductor layer 340, a transparent conductor layer 350, an electrode 5 and an electrode 6.

The above-mentioned N-type doped semiconductor layer 320 is disposed on the substrate 310, while the active layer 330 is disposed between the P-type doped semiconductor layer 340 and the N-type doped semiconductor layer 320. Besides, the transparent conductor layer 350 and the electrode 5 are disposed on the P-type doped semiconductor layer 340, while the electrode 6 is disposed on the N-type doped semiconductor layer 320.

In addition, the diode 302 is disposed on the substrate 310 and includes a P-type doped region 362, an N-type doped region 364, an electrode 7 and an electrode 8. The electrode 7 is disposed on the P-type doped region 362, while the electrode 8 is disposed on the N-type doped region 364. In addition, the electrodes 5 and 8 are electrically coupled to an operation voltage V1 through a conductive wire, while the electrodes 6 and 7 are electrically coupled to an operation voltage V2 through another conductive wire. In other words, the diode 302 is reverse and parallel connected to the LED 301 (as shown in FIG. 3B).

When electrostatic discharge (ESD) occurs, the electrostatic high-voltage characteristic enables the diode 302 (as shown in FIG. 3B) to operate in a breakdown voltage zone thereof and the static charges would pass through the diode 302 instead of passing through the LED 301. Hence, the LED 301 is protected from electrostatic discharge damage. However, to connect the electrode 5 to the electrode 8, a long conductive wire is required and an excessive long wire would deteriorate the reliability of the LED chip 300. In addition, since the diode 302 occupies a partial area of the substrate 310, therefore the usable light-emitting area of the LED 301 is relatively decreased, which affects the LED brightness.

SUMMARY OF THE INVENTION

Accordingly, the present invention is directed to provide an LED chip capable of preventing from electrostatic discharge damage (ESD damage), which is superior not only in easy fabrication, but also in high reliability.

As embodied and broadly described herein, the present invention provides an LED chip including a substrate, an electrostatic conducting layer, a first type doped semiconductor layer, an active layer, a second type doped semiconductor layer, a first electrode and a second electrode is provided. The electrostatic conducting layer is disposed on the substrate, while the first type doped semiconductor layer is disposed on a partial area of the electrostatic conducting layer. Besides, the active layer is disposed on a partial area of the first type doped semiconductor layer, while the second type doped semiconductor layer is disposed on the active layer. The first electrode is disposed on the first type doped semiconductor layer, while the second electrode is disposed on the second type doped semiconductor layer.

In an embodiment of the present invention, the LED chip further includes a first Schottky contact electrode disposed, for example, on the electrostatic conducting layer and electrically connected to the second electrode.

In an embodiment of the present invention, the LED chip further includes a first conductive wire electrically connected to the first Schottky contact electrode and the second electrode.

In an embodiment of the present invention, the LED chip further includes a second Schottky contact electrode disposed, for example, on the electrostatic conducting layer and electrically connected to the first electrode.

In an embodiment of the present invention, the LED chip further includes a second conductive wire coupled to the second Schottky contact electrode and the first electrode.

In an embodiment of the present invention, the LED chip further includes a barrier layer, which is disposed, for example, between the first type doped semiconductor layer and the electrostatic conducting layer.

In an embodiment of the present invention, the barrier layer and the second type doped semiconductor layer are made of, for example, a material with same doping-type. In addition, the electrostatic conducting layer and the first type doped semiconductor layer are made of, for example, a material with same doping type.

In an embodiment of the present invention, the LED chip further includes a third Schottky contact electrode, which is disposed on the electrostatic conducting layer and is electrically connected to the first electrode.

In an embodiment of the present invention, the LED chip further includes a third conductive wire, which is electrically connected, for example, to the third Schottky contact electrode and the first electrode.

In an embodiment of the present invention, the LED chip further includes a third Schottky contact electrode, which is disposed, for example, on the electrostatic conducting layer and is electrically connected to the second electrode.

In an embodiment of the present invention, the LED chip further includes a third conductive wire, which is electrically connected to, for example, the third Schottky contact electrode and the second electrode.

In an embodiment of the present invention, the LED chip further includes a fourth Schottky contact electrode, which is disposed, for example, on the barrier layer and is electrically connected to the first electrode.

In an embodiment of the present invention, the LED chip further includes a fourth conductive wire, which is electrically connected to, for example, the fourth Schottky contact electrode and the first electrode.

In an embodiment of the present invention, the first type doped semiconductor layer is, for example, an N-type doped semiconductor layer, while the second type doped semiconductor layer is, for example, a P-type doped semiconductor layer.

In an embodiment of the present invention, the material of the electrostatic conducting layer includes, for example, gallium nitride (GaN) based material.

In an embodiment of the present invention, the active layer includes, for example, multi-quantum-well layer (MQW layer).

In summary, the LED chip of the present invention has an electrostatic conducting layer disposed between the substrate and the first type doped semiconductor layer. When electrostatic discharge occurs, the static charges pass through the electrostatic conducting layer and are expelled from the LED chip; therefore, the LED chip of the present invention has electrostatic discharge protection function (ESD protection function). Furthermore, the structure of the present invention is simple and can be easily fabricated.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

The First Embodiment

Figure 4A:
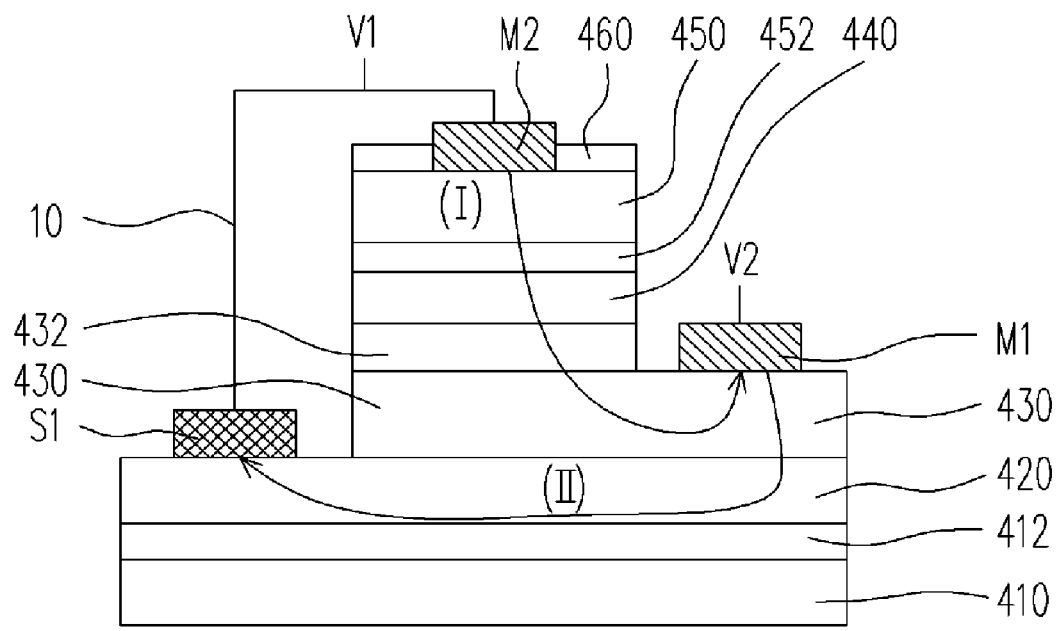
FIG. 4A is a diagram of an LED chip provided by the first embodiment of the present invention.
Figure 4B:
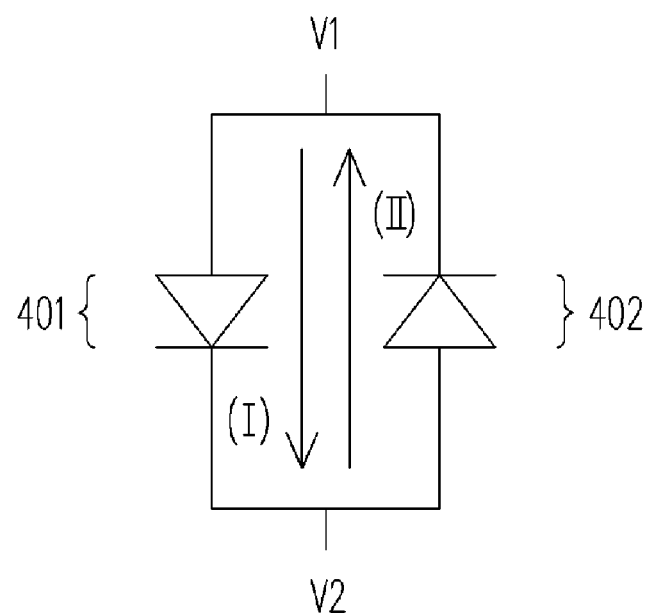
FIG. 4B is the equivalent circuit diagram of the LED chip provided by the first embodiment of the present invention.

FIG. 4A is a diagram of an LED chip provided by the first embodiment of the present invention and FIG. 4B is the equivalent circuit diagram of the LED chip provided by the first embodiment of the present invention. Referring to FIGS. 4A and 4B, an LED chip 400 of the present invention includes a substrate 410, an electrostatic conducting layer 420, a first type doped semiconductor layer 430, an active layer 440, a second type doped semiconductor layer 450, a first electrode M1 and a second electrode M2. The electrostatic conducting layer 420 is disposed on the substrate 410. Usually, a buffer layer 412 is optionally formed between the substrate 410 and the electrostatic conducting layer 420 for enhancing the lattice matching characteristic between the electrostatic conducting layer 420 and the substrate 410. The material of the above-mentioned buffer layer 412 is, for example, $Al_aGa_bIn_{1-a-b}$ ($0 \leq a, b<1; 0 \leq a+b \leq 1$), while the material of the electrostatic conducting layer 420 is, for example, gallium nitride (GaN) based material.

The first type doped semiconductor layer 430 in the embodiment is disposed on a partial area of the electrostatic conducting layer 420, while the second type doped semiconductor layer 450 is disposed on the active layer 440. The above-mentioned first type doped semiconductor layer 430 is, for example, an N-type doped semiconductor layer, while the second type doped semiconductor layer 450 is, for example, a P-type doped semiconductor layer and the active layer 440 is, for example, a multi-quantum-well layer (MQW layer).

Generally, the light radiation principle of the LED chip 400 is based on electron-hole recombination for releasing photons in the active layer 440. However, the mobility of the electrons and the holes in the active layer 440 is different, which affects the recombination probability of the electrons and the holes in the active layer 440. To solve the problem in the embodiment, an N-type cladding layer 432 may be disposed between the first type doped semiconductor layer 430 and the active layer 440, while a P-type cladding layer 452 may be disposed between the second type doped semiconductor layer 450 and the active layer 440. The N-type cladding layer 432 and the P-type cladding layer 452 are used mainly for enhancing the recombination probability of the electrons and the holes in the active layer 440.

In addition, the first electrode M1 is disposed on the first type doped semiconductor layer 430, while the second electrode M2 is disposed on the second type doped semiconductor layer 450. The LED chip 400 of the present embodiment may include a transparent conductor layer 460, which is disposed on the second type doped semiconductor layer 450. The material of the transparent conductor layer 460 is, for example, indium tin oxide (ITO), indium zinc oxide (IZO), or other materials. The LED chip 400 of the embodiment further includes a first Schottky contact electrode S1 disposed on the electrostatic conducting layer 420 and the first Schottky contact electrode S1 is a metallic film layer made of, for example, nickel (Ni), gold (Au), aluminum (Al), chrome (Cr) or titanium nitride (TiN). The first Schottky contact electrode S1 is electrically connected to the second electrode M2 through a first conductive wire 10. It is noted that, the interface between the first Schottky contact electrode S1 and the electrostatic conducting layer 420 is a Schottky junction.

The first electrode M1 is electrically coupled to an operation voltage V2, while the second electrode M2 is electrically coupled to an operation voltage V1 via the first conductive wire 10. As the LED chip 400 operates under a normal voltage, due to a Schottky junction between the electrostatic conducting layer 420 and the first Schottky contact electrode S1, the current would pass through a path I so that the LED 401 in FIG. 4B would radiate.

When an electrostatic discharge occurs, the electrostatic high-voltage may apply to the first electrode M1 and the electrostatic high-voltage characteristic makes the diode 402 (as shown in FIG. 4B) operate in the breakdown voltage zone thereof, so that the electrostatic current flows through the diode 402, instead of the LED 401. That is, the sequence of the electrostatic current flows through the path II (as shown in FIG. 4A) is from the first electrode M1, through the first type doped semiconductor layer 430, the electrostatic conducting layer 420, to the first Schottky contact electrode S1. Thus, the static charges are conducted by the diode 402 and expelled from the LED chip 400 through the first conductive wire 10, and consequently the LED 401 is protected from electrostatic discharge damage.

Figure 1A:
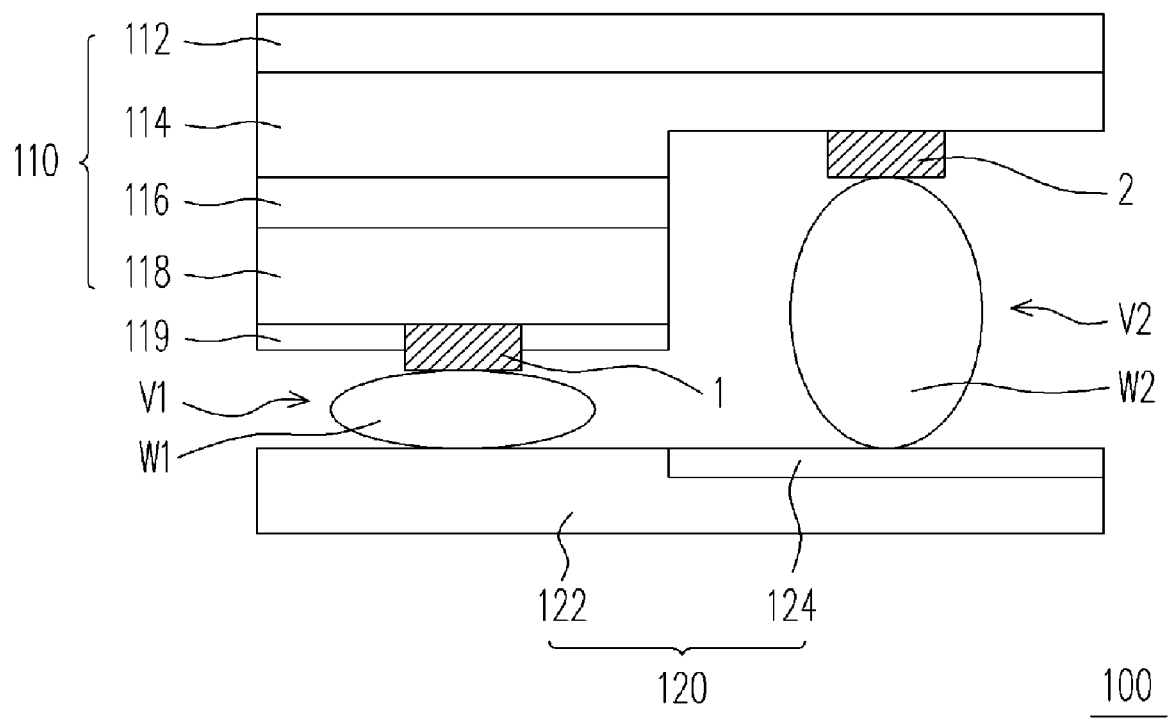
FIG. 1A is a diagram of a conventional flip-chip packaged LED chip.
Figure 1B:
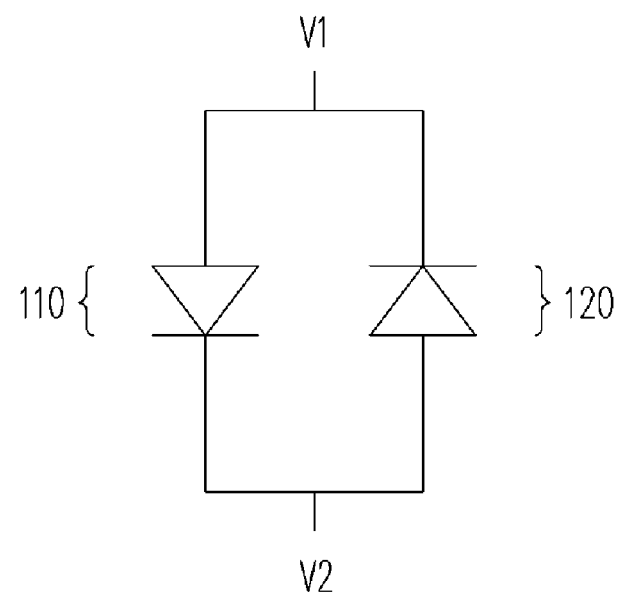
FIG. 1B is a diagram of the LED circuit in FIG. 1A.
Figure 2A:
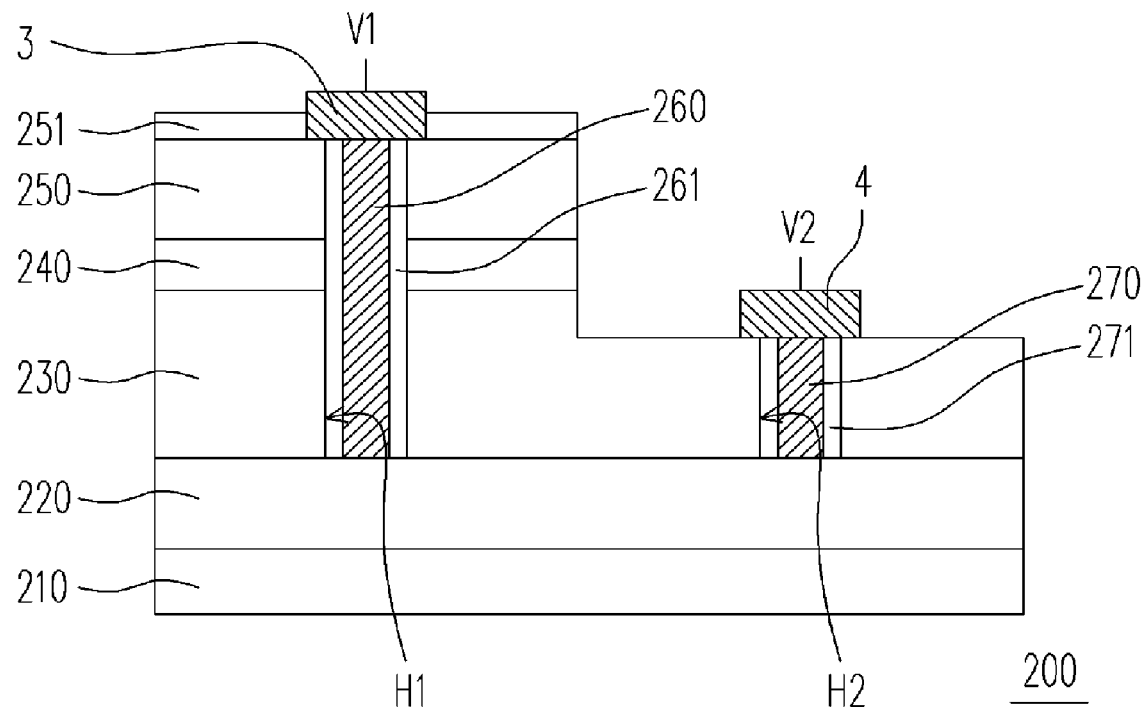
FIG. 2A is a diagram of another conventional LED chip.
Figure 2B:
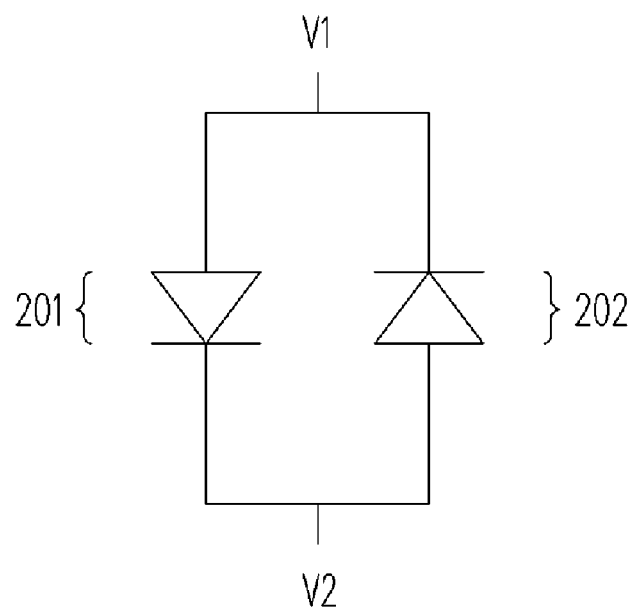
FIG. 2B is a diagram of the LED circuit in FIG. 2A.
Figure 3A:
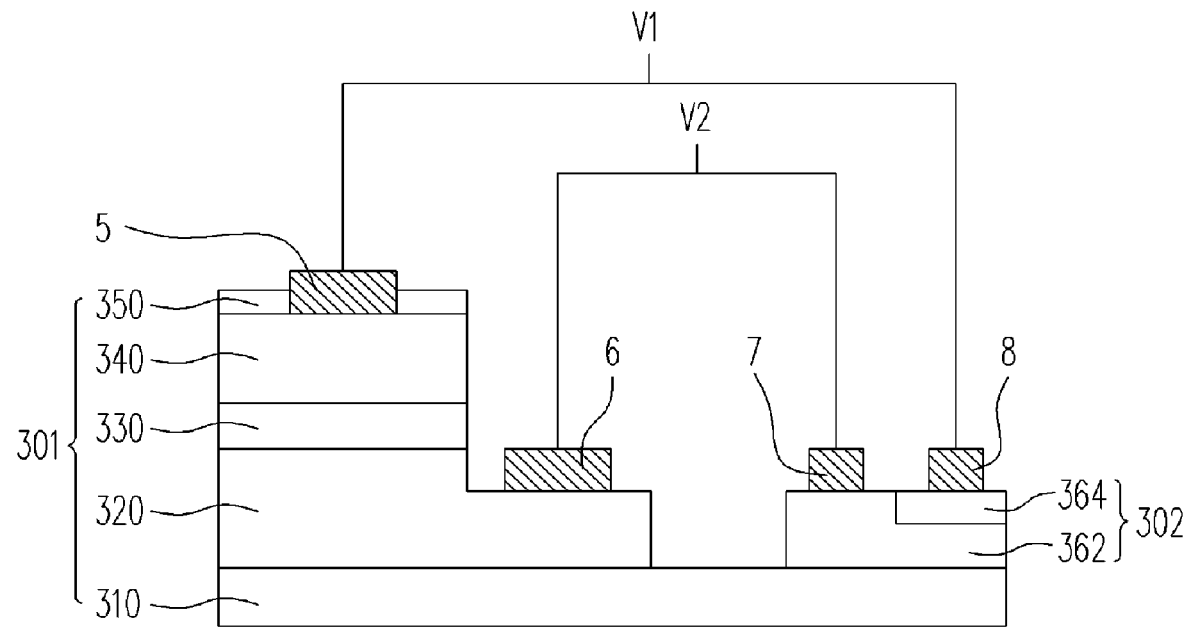
FIG. 3A is a diagram of a further conventional LED chip.
Figure 3B:
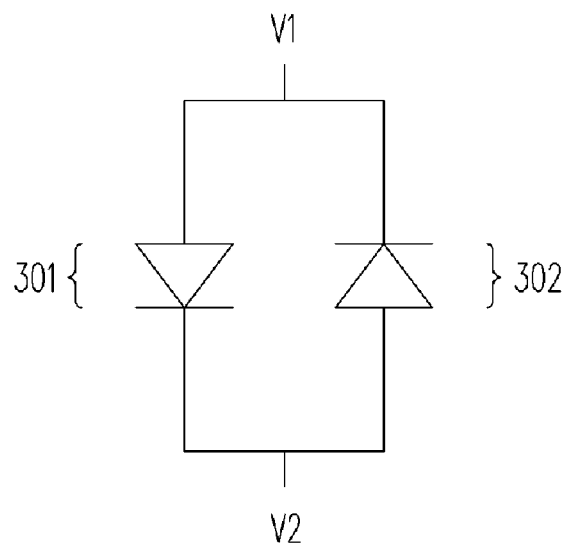
FIG. 3B is a diagram of the LED circuit in FIG. 3A.

In the present invention, the electrostatic conducting layer 420 is used as the path to expel the static charges so that the LED chip 400 is prevented from electrostatic damage. In comparison with the prior art, the LED chip of the present invention has simpler structure and is easier to be fabricated. Further, since the distance between the second electrode M2 and the first Schottky contact electrode S1 is shorter than the one between the electrode 5 and the electrode 8 in the prior art (as shown in FIG. 3A), the shorter first conductive wire can avoid the problem of low reliability of the conventional LED chip 300.

The Second Embodiment

Figure 4C:
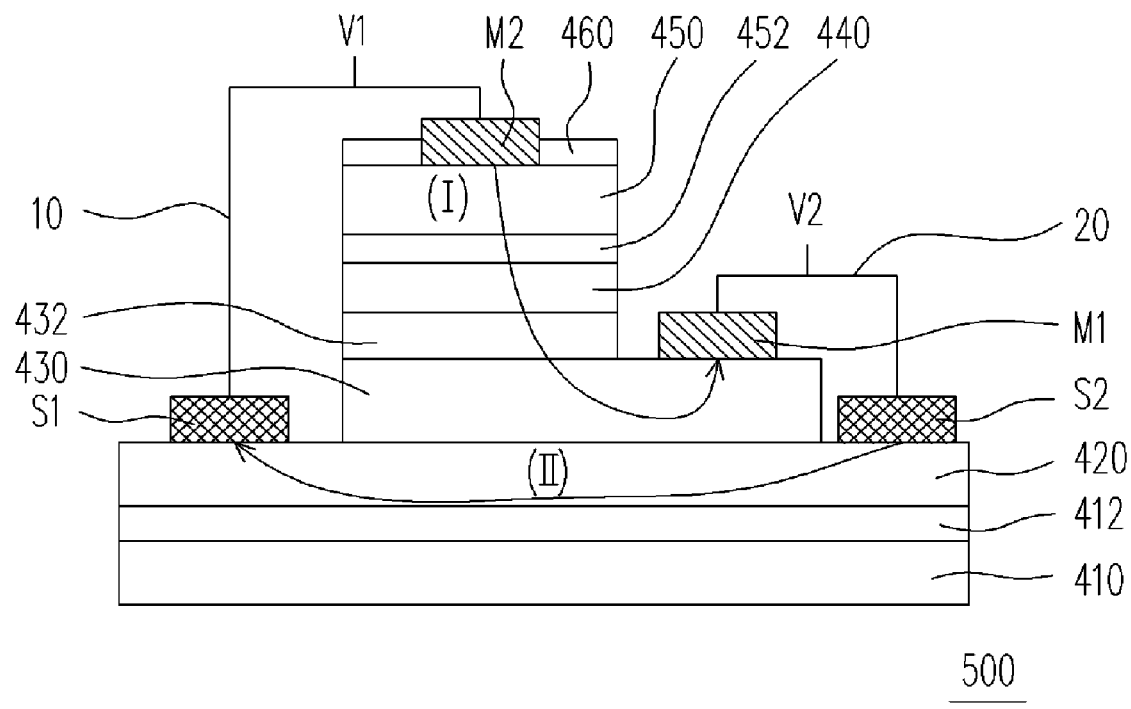
FIG. 4C is a diagram of an LED chip provided by the second embodiment of the present invention.
Figure 4D:
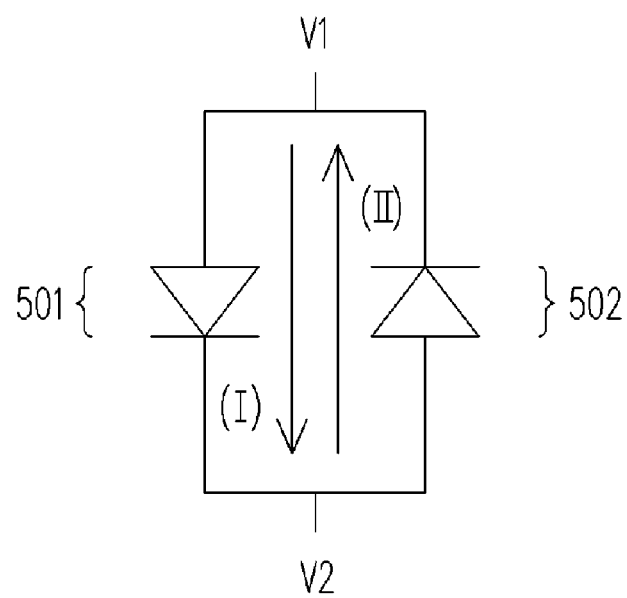
FIG. 4D is the equivalent circuit diagram of the LED chip provided by the second embodiment of the present invention.

FIG. 4C is a diagram of an LED chip provided by the second embodiment of the present invention and FIG. 4D is the equivalent circuit diagram of the LED chip provided by the second embodiment of the present invention. Please refer to FIGS. 4C and 4D together. The second embodiment is similar to the first embodiment, except the electrode number and the disposition positions of the Schottky contact electrodes employed in the second embodiment. In more detail, the LED chip 500 further includes a second Schottky contact electrode S2 disposed on the electrostatic conducting layer 420 and the second Schottky contact electrode S2 is connected to the first electrode M1, for example, through a second conductive wire 20.

As the LED chip 500 operates under a normal voltage, due to a Schottky junction between the electrostatic conducting layer 420 and the second Schottky contact electrode S2, the current would pass through a path I that the LED 501 in FIG. 4D would radiate.

When an electrostatic discharge occurs, the electrostatic high-voltage may apply to the first electrode M1 and the second Schottky contact electrode S2; the electrostatic high-voltage characteristic makes the diode 502 (as shown in FIG. 4D) operate in the breakdown voltage zone thereof, so that the electrostatic current flows through the diode 502. In other words, the sequence of the electrostatic current flows through the path II (as shown in FIG. 4C), is from the second Schottky contact electrode S2, through the electrostatic conducting layer 420, to the first Schottky contact electrode S1. Thus, the static charges are conducted by the diode 502 and expelled from the LED chip 500 through the first conductive wire 10, and consequently the LED 501 is protected from electrostatic discharge damage.

It is noticeable that only one of the first Schottky contact electrode S1 and the second Schottky contact electrode S2 is required to have a Schottky junction interfaced with the electrostatic conducting layer 420. In the embodiment, not both of the Schottky contact electrodes S1 and S2 are intentionally defined to have Schottky junction interfaced with the electrostatic conducting layer 420.

The Third Embodiment

Figure 5A:
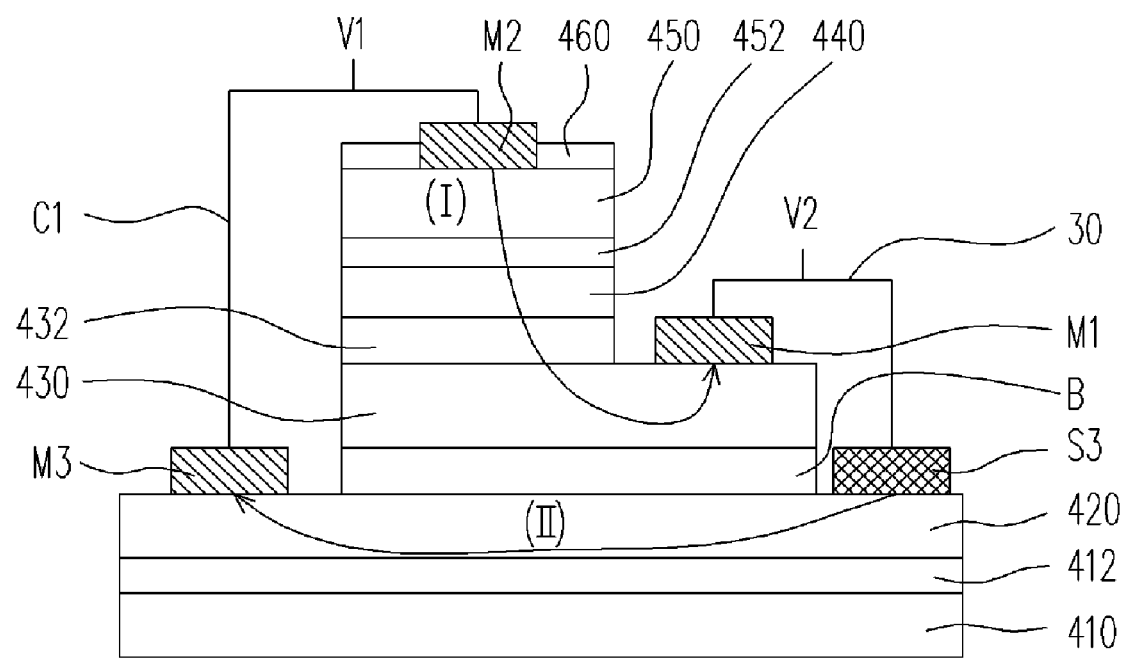
FIG. 5A is a diagram of an LED chip provided by the third embodiment of the present invention.
Figure 5B:
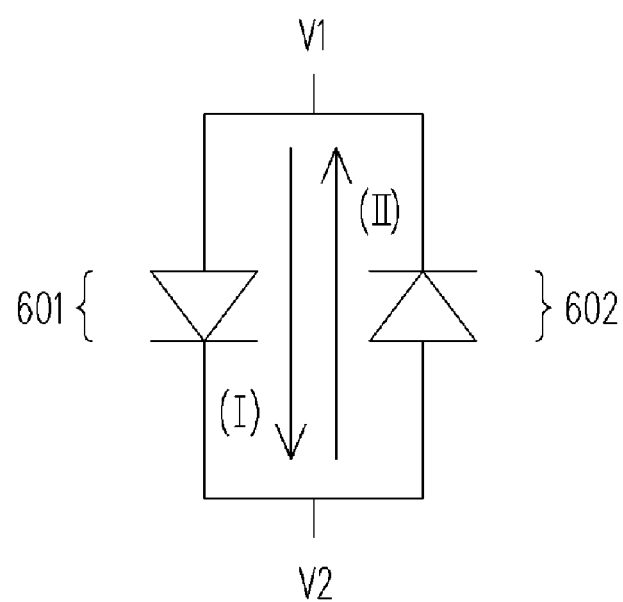
FIG. 5B is the equivalent circuit diagram of the LED chip provided by the third embodiment of the present invention.

FIG. 5A is a diagram of an LED chip provided by the third embodiment of the present invention and FIG. 5B is the equivalent circuit diagram of the LED chip provided by the third embodiment of the present invention. Referring to FIGS. 5A and 5B, the third embodiment is quite similar to the second embodiment, except that the LED chip 600 of the embodiment further includes a barrier layer B disposed, for example, between the electrostatic conducting layer 420 and the first type doped semiconductor layer 430. The doping type material of the barrier layer B is different from that of the electrostatic conducting layer 420. The material of the barrier layer B can be gallium nitride (GaN) based material or other insulation materials.

In detail, the barrier layer B and the second type doped semiconductor layer 450 are made of, for example, material with a same doping type and the electrostatic conducting layer 420 and the first type doped semiconductor layer 430 are made of, for example, material with a same doping type. Besides, the LED chip 600 of the embodiment further includes a third Schottky contact electrode S3 replacing the second Schottky contact electrode S2 in FIG. 4C.

The third Schottky contact electrode S3 is disposed on the electrostatic conducting layer 420 and the interface between the third Schottky contact electrode S3 and the electrostatic conducting layer 420 is a Schottky junction. The third Schottky contact electrode S3 is electrically connected to the first electrode M1 through, for example, a third conductive wire 30. In addition, the LED chip 600 of the embodiment includes, for example, a third electrode M3 disposed on the electrostatic conducting layer 420 and electrically connected to the second electrode M2 through, for example, a conductive wire C1.

As the LED chip 600 operates under a normal voltage, due to a Schottky junction between the electrostatic conducting layer 420 and the third Schottky contact electrode S3, the current would pass through a path I that the LED 601 in FIG. 5B would radiate.

When an electrostatic discharge occurs, the electrostatic high-voltage may apply to the first electrode M1 and the third Schottky contact electrode S3 (the third conductive wire 30); the electrostatic high-voltage characteristic makes the diode 602 (as shown in FIG. 5B) operate in the breakdown voltage zone thereof, so that the electrostatic current flows through the diode 602. In other words, the sequence the electrostatic current flows through the path II is from the third Schottky contact electrode S3, through the electrostatic conducting layer 420, to the third Schottky contact electrode S3. Thus, the static charges are conducted by the diode 602 and expelled from the LED chip 600 through the conductive wire C1, and consequently the LED 601 is protected from electrostatic discharge damage.

The Fourth Embodiment

Figure 5C:
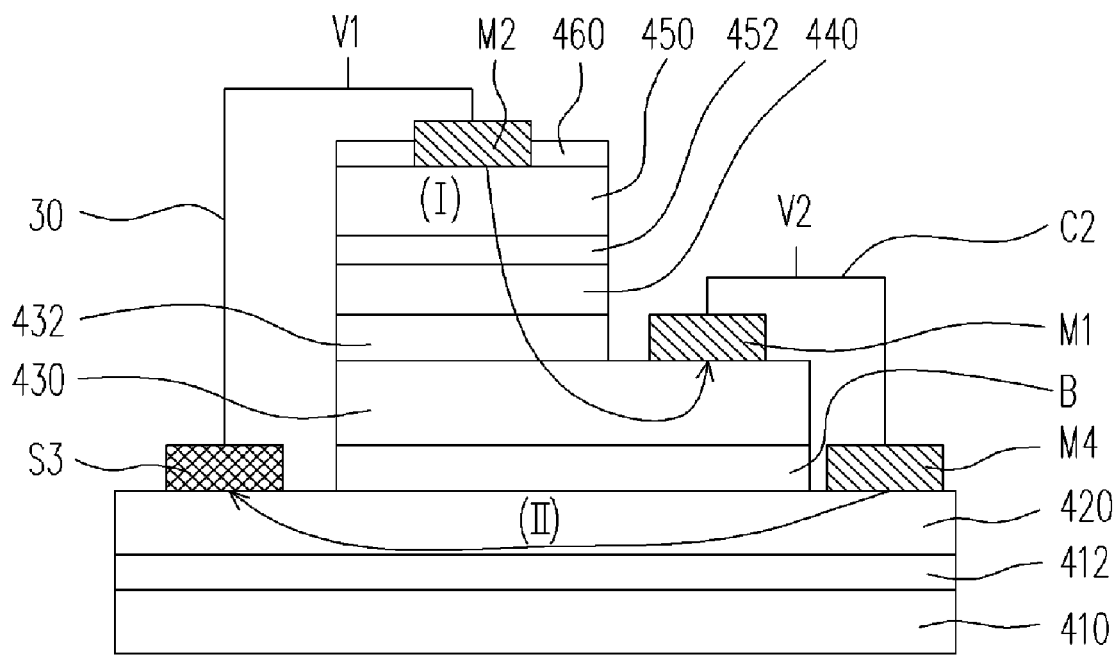
FIG. 5C is a diagram of an LED chip provided by the fourth embodiment of the present invention.
Figure 5D:
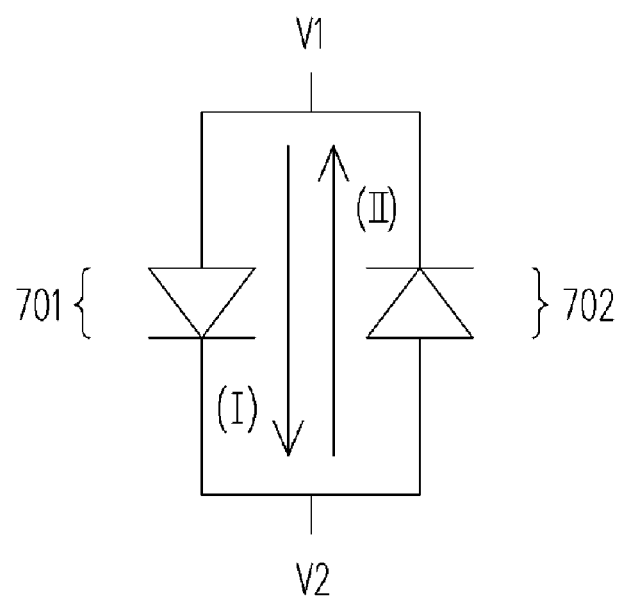
FIG. 5D is the equivalent circuit diagram of the LED chip provided by the fourth embodiment of the present invention.

FIG. 5C is a diagram of an LED chip provided by the fourth embodiment of the present invention and FIG. 5D is the equivalent circuit diagram of the LED chip provided by the fourth embodiment of the present invention. Referring to FIGS. 5C and 5D, the fourth embodiment is quite similar to the third embodiment, except the disposition positions of the Schottky contact electrodes employed in the third embodiment. In more detail, the third Schottky contact electrode S3 of the LED chip 700 is disposed on the electrostatic conducting layer 420 and the third Schottky contact electrode S3 is electrically connected to the second electrode M2 through a third conductive wire 30. Please note that the interface between the third Schottky contact electrode S3 and the electrostatic conducting layer 420 is a Schottky junction.

Besides, the LED chip 700 of the embodiment includes, for example, a fourth electrode M4 disposed on the electrostatic conducting layer 420 and the fourth electrode M4 is electrically connected to the first electrode M1 through a conductive wire C2. In this way, the LED 701 of the embodiment is protected from electrostatic damage.

The Fifth Embodiment

Figure 6A:
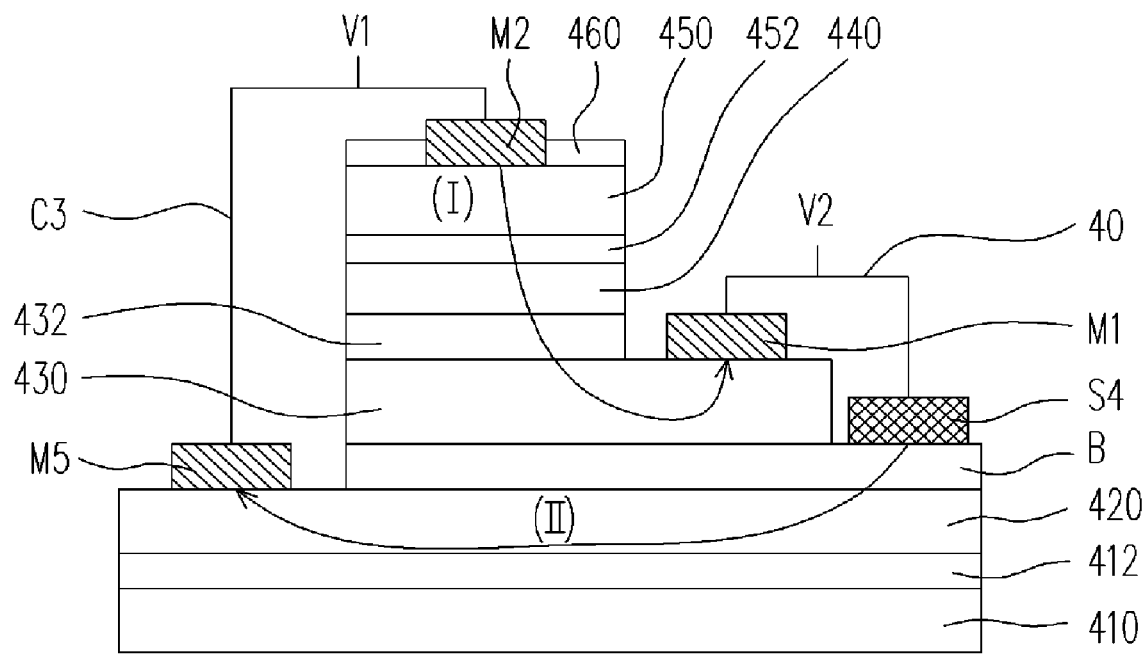
FIG. 6A is a diagram of an LED chip provided by the fifth embodiment of the present invention.
Figure 6B:
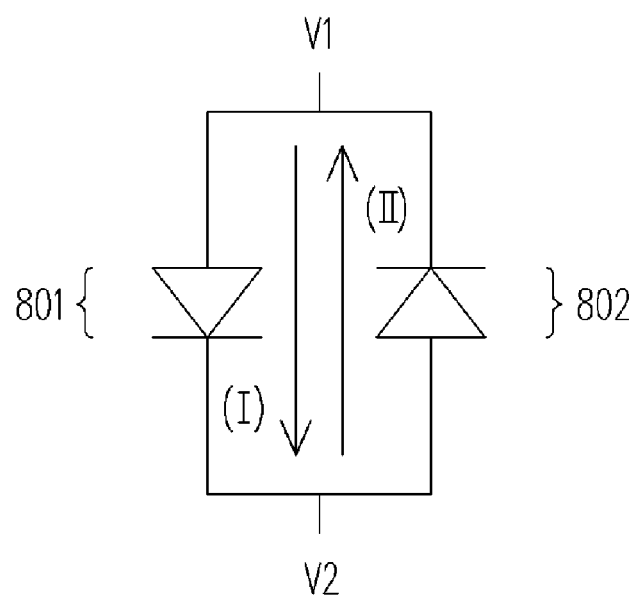
FIG. 6B is the equivalent circuit diagram of the LED chip provided by the fifth embodiment of the present invention.

FIG. 6A is a diagram of an LED chip provided by the fifth embodiment of the present invention and FIG. 6B is the equivalent circuit diagram of the LED chip provided by the fifth embodiment of the present invention. Referring to FIGS. 6A and 6B, the fifth embodiment is quite similar to the fourth embodiment, except the disposition positions of the Schottky contact electrodes employed in the fourth embodiment.

In more detail, the LED chip 800 of the embodiment further includes a fourth Schottky contact electrode S4 disposed on the barrier layer B and the fourth Schottky contact electrode S4 is electrically connected to the first electrode M1 through, for example, a fourth conductive wire 40. The doping type material of the barrier layer B is different from that of the electrostatic conducting layer 420. The material of the above-described barrier layer B is, for example, P-type doped gallium nitride (GaN) based material, while the material of the electrostatic conducting layer 420 is N-type doped gallium nitride (GaN) based material.

As the LED chip 800 operates under a normal voltage, due to a Schottky junction between the electrostatic conducting layer 420 and the fourth Schottky contact electrode S4, the current would pass through a path I, which makes the LED 801 in FIG. 6B radiate.

When an electrostatic discharge occurs, the electrostatic high-voltage may apply to the first electrode M1 and the fourth Schottky contact electrode S4 (the fourth conductive wire 40); the electrostatic high-voltage characteristic makes the diode 802 (as shown in FIG. 6B) operate in the breakdown voltage zone thereof, so that the electrostatic current flows through the diode 802. The sequence the electrostatic current flows through the path II i.e. is from the fourth Schottky contact electrode S4, through the barrier layer B, the electrostatic conducting layer 420, to the fifth electrode M5. Thus, the static charges are conducted by the diode 802 and expelled from the LED chip 800 through a conductive wire C3, and consequently the LED 801 is protected from electrostatic discharge damage.

In summary, the LED chip of the present invention has at least the following advantages:

1. The LED chip of the present invention includes an electrostatic conducting layer disposed between the substrate and the first type doped semiconductor layer; the electrostatic conducting layer is served as the path for expelling static electricity so as to protect the LED chip from electrostatic damage.

2. The LED chip of the present invention is superior in simple structure and easy fabrication. In addition, in the LED chip of the present invention, the conductive wires between electrodes are shorter, which improves the reliability of the LED chip.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An light-emitting diode (LED) chip, comprising:
    a substrate;
    an electrostatic conducting layer, disposed on the substrate;
    a light-emitting stacked layer disposed on the electrostatic conducting layer, wherein there is no via hole within the light-emitting stacked layer, and the light-emitting stacked layer comprises:
        a first type doped semiconductor layer, disposed on a partial area of the electrostatic conducting layer;
        an active layer, disposed on a partial area of the first type doped semiconductor layer;
        a second type doped semiconductor layer, disposed on the active layer;
        a first electrode, disposed on the first type doped semiconductor layer; and
        a second electrode, disposed on the second type doped semiconductor layer.

2. The LED chip as recited in claim 1, further comprising a first Schottky contact electrode, disposed on the electrostatic conducting layer, wherein the first Schottky contact electrode is electrically connected to the second electrode.

3. The LED chip as recited in claim 2, further comprising a first conductive wire, wherein the first conductive wire is electrically connected to the first Schottky contact electrode and the second electrode.

4. The LED chip as recited in claim 1, wherein the first type doped semiconductor layer is an N-type doped semiconductor layer, while the second type doped semiconductor layer is a P-type doped semiconductor layer.

5. The LED chip as recited in claim 1, wherein the material of the electrostatic conducting layer comprises gallium nitride (GaN) based material.

6. The LED chip as recited in claim 1, wherein the active layer comprises a multi-quantum-well layer (MQW layer).

7. The LED chip as recited in claim 1, wherein the light-emitting stacked layer further comprises:
    a first type doped cladding layer disposed between the first type doped semiconductor layer and the active layer, and
    a second type doped cladding layer disposed between the second type doped semiconductor layer and the active layer.

8. The LED chip as recited in claim 1, further comprising a buffer layer disposed between the substrate and the electrostatic conducting layer.

9. The LED chip as recited in claim 1, wherein the electrostatic conducting layer entirely covers the substrate.

10. The LED chip as recited in claim 1, wherein only a portion area of a top surface of the first type doped semiconductor layer is covered by the active layer.

11. The LED chip as recited in claim 1, wherein a sidewall of the first type doped semiconductor layer is not aligned with a sidewall of the electrostatic conducting layer.

12. The LED chip as recited in claim 2, wherein only a portion area of a top surface of the electrostatic conducting layer is covered by the light-emitting stacked layer, and the first Schottky contact electrode is disposed on the top surface of the electrostatic conducting layer uncovered by the light-emitting stacked layer.

* * * * *